(12) United States Patent
Chou et al.

(10) Patent No.: US 9,944,516 B2
(45) Date of Patent: Apr. 17, 2018

(54) HIGH ASPECT RATIO ETCH WITHOUT UPPER WIDENING

(71) Applicant: Taiwan Semiconductor Manufacturing Co., Ltd., Hsin-Chu (TW)

(72) Inventors: Chung-Yen Chou, Hsinchu (TW); Chia-Shiung Tsai, Hsin-Chu (TW); Lee-Chuan Tseng, New Taipei (TW); Ru-Liang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/699,131

(22) Filed: Apr. 29, 2015

(65) Prior Publication Data

US 2016/0318758 A1    Nov. 3, 2016

(51) Int. Cl.
| | | |
|---|---|---|
| *H01L 29/84* | (2006.01) |
| *B81C 1/00* | (2006.01) |
| *B81B 3/00* | (2006.01) |
| *H01L 21/308* | (2006.01) |

(52) U.S. Cl.
CPC ........ *B81C 1/00619* (2013.01); *B81B 3/0021* (2013.01); *H01L 21/3083* (2013.01); *B81B 2203/0163* (2013.01)

(58) Field of Classification Search
CPC ......... H01L 21/76232; H01L 21/76898; H01L 21/486; H01L 21/76877; H01L 23/481; H01L 23/5226; H01L 23/562; B81C 1/00619; B81B 3/0021; B81B 2203/0163
See application file for complete search history.

(56) References Cited

U.S. PATENT DOCUMENTS

| | | | | |
|---|---|---|---|---|
| 6,008,103 A * | 12/1999 | Hoepfner | .......... | H01L 29/66181 257/E21.396 |
| 6,313,008 B1 * | 11/2001 | Leung | .............. | H01L 21/76232 257/510 |
| 7,939,403 B2 * | 5/2011 | Grisham | .......... | H01L 21/76232 257/E21.646 |
| 2001/0023960 A1 * | 9/2001 | Soga | ................ | H01L 21/76232 257/330 |

(Continued)

*Primary Examiner* — Khiem D Nguyen
(74) *Attorney, Agent, or Firm* — Eschweiler & Potashnik, LLC (57) ABSTRACT

A method for performing a high aspect ratio etch is provided. A semiconductor substrate is provided with a hard mask layer arranged over the semiconductor substrate. A first etch is performed into the hard mask layer to form a hard mask opening exposing the semiconductor substrate. The hard mask opening has a bottom width. A second etch is performed into the semiconductor substrate, through the hard mask opening, to form a substrate opening with a top width that is about equal to the bottom width of the hard mask opening. A protective layer is formed lining a sidewall of the substrate opening. A third etch is performed into the semiconductor substrate, through the hard mask opening, to increase a height of the substrate opening. The top width of the substrate opening remains substantially unchanged during the third etch. A semiconductor structure with a high aspect ratio opening is also provided.

20 Claims, 6 Drawing Sheets

(56) References Cited

U.S. PATENT DOCUMENTS

| | | | | |
|---|---|---|---|---|
| 2005/0064678 A1* | 3/2005 | Dudek | ............. | H01L 21/76232 438/424 |
| 2006/0264054 A1* | 11/2006 | Gutsche | ............ | H01L 21/30655 438/696 |
| 2007/0212848 A1* | 9/2007 | Sandhu | ............. | H01L 21/76232 438/424 |
| 2010/0047963 A1* | 2/2010 | Wang | .................... | H01L 21/187 438/107 |
| 2010/0167496 A1* | 7/2010 | Koo | ................. | H01L 21/76232 438/437 |
| 2011/0183482 A1* | 7/2011 | Lee | .................. | H01L 21/76232 438/270 |
| 2012/0190169 A1* | 7/2012 | Chin | ................ | H01L 21/76232 438/430 |
| 2012/0256244 A1* | 10/2012 | Grisham | ........... | H01L 21/76232 257/296 |
| 2015/0102437 A1* | 4/2015 | Liu | ....................... | B81B 3/0021 257/419 |

* cited by examiner

HIGH ASPECT RATIO ETCH WITHOUT UPPER WIDENING

BACKGROUND

High aspect ratio etches are typically performed during the manufacture of integrated circuits to form openings with high aspect ratios. High aspect ratio etches may find application in increasing the density of integrated circuit components (e.g., transistors, diodes, resistors, capacitors, inductors, etc.). For example, high aspect ratio etches may be used to form trench capacitors, trench memory cells, trench isolation, trench transistors, or other integrated circuit components exploiting three dimensional structural concepts. Further, high aspect ratio etches may find application in forming silicon pillars, microelectromechanical structures (MEMS) devices, or other semiconductor structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method for performing high aspect ratio etches into silicon substrates may include forming a hard mask layer over a silicon substrate with a hard mask opening. Thereafter, a plasma etch may be performed into the silicon substrate through the hard mask opening to form a high aspect ratio opening. Ideally, the top width of the high aspect ratio opening would match the width of the hard mask. However, while the top width of the high aspect ratio opening typically matches the width of the hard mask when the high aspect ratio opening is shallow (i.e., has a short etch time), the same cannot be said when the high aspect ratio opening is deep (i.e., has a long etch time). When the high aspect ratio opening is deep, the top width of the high aspect ratio opening enlarges beyond the width of the hard mask during the plasma etch.

Enlarging top widths pose challenges for numerous applications calling for a high level of control over the top widths. For example, silicon pillars may call for high aspect ratio openings with heights of about 100 micrometers and top widths of about 1.2 micrometers. During the formation of the silicon pillars, a hard mask layer may be formed over a silicon substrate with hard mask openings having widths of about 1.2 micrometers. Further, a plasma etch may be performed into the silicon substrate through the hard mask openings. However, even though the hard mask openings have widths of about 1.2 micrometers, the top widths of the high aspect ratio openings may enlarge to about 3 micrometers during the plasma etch. As another example, when filling a high aspect ratio opening with polysilicon, polysilicon void control may be dependent upon a high level of control over the top width of the opening.

A solution to enlarging top widths is to form hard mask openings with smaller widths than targeted for corresponding high aspect ratio openings. The top widths of the high aspect ratio openings then enlarge towards the targeted top widths during performance of plasma etches. However, such a solution does not allow for a high level of control over the final top widths of the high aspect ratio openings. Further, the plasma etches take longer to complete because the amount of plasma exposed to silicon substrates is reduced. This, in turn, reduces the wafers per hour (WPH) that can be processed and hence reduces throughput.

In view of the foregoing, the present application is directed to a method for performing high aspect ratio etches, as well as the resulting semiconductor structure. According to the method, a silicon substrate is provided with a hard mask layer overlying the silicon substrate. Thereafter, a first etch is performed into the hard mask layer to form a hard mask opening exposing the silicon substrate and having a first, bottom width. Further, a second etch is performed into the silicon substrate, through the hard mask opening, to form a substrate opening with a second, top width that is about equal (e.g., +/−1%) to the first width. With the substrate opening formed, a protective layer is formed lining sidewalls of the substrate opening and a third etch is performed into the silicon substrate. In some embodiments, the protective layer is the same material as the hard mask layer. The third etch is performed into the silicon substrate, through the substrate opening, to increase a height of the substrate opening. During the third etch, the top width of the substrate opening remains substantially unchanged (e.g., +/−1%).

The protective layer advantageously prevents widening of the substrate opening while performing the third etch. The selectivity between silicon and the material of the protective layer is high (e.g., about 100) so as to protect the top of the substrate opening. This, in turn, results in a top width that is controlled to a high level. Further, the protective layer advantageously allows the second and third etches to be completed more quickly. The high selectivity between silicon and the material of the protective layer allows a more aggressive etch recipe. Further, since there is no widening of the substrate opening, the initial width of the substrate opening can be larger than it would otherwise be, thereby allowing more etchant to come in contact with the silicon substrate. By allowing the second and third etches to be completed more quickly, the WPH that can be processed are increased, and throughput is improved.

Figure 1:
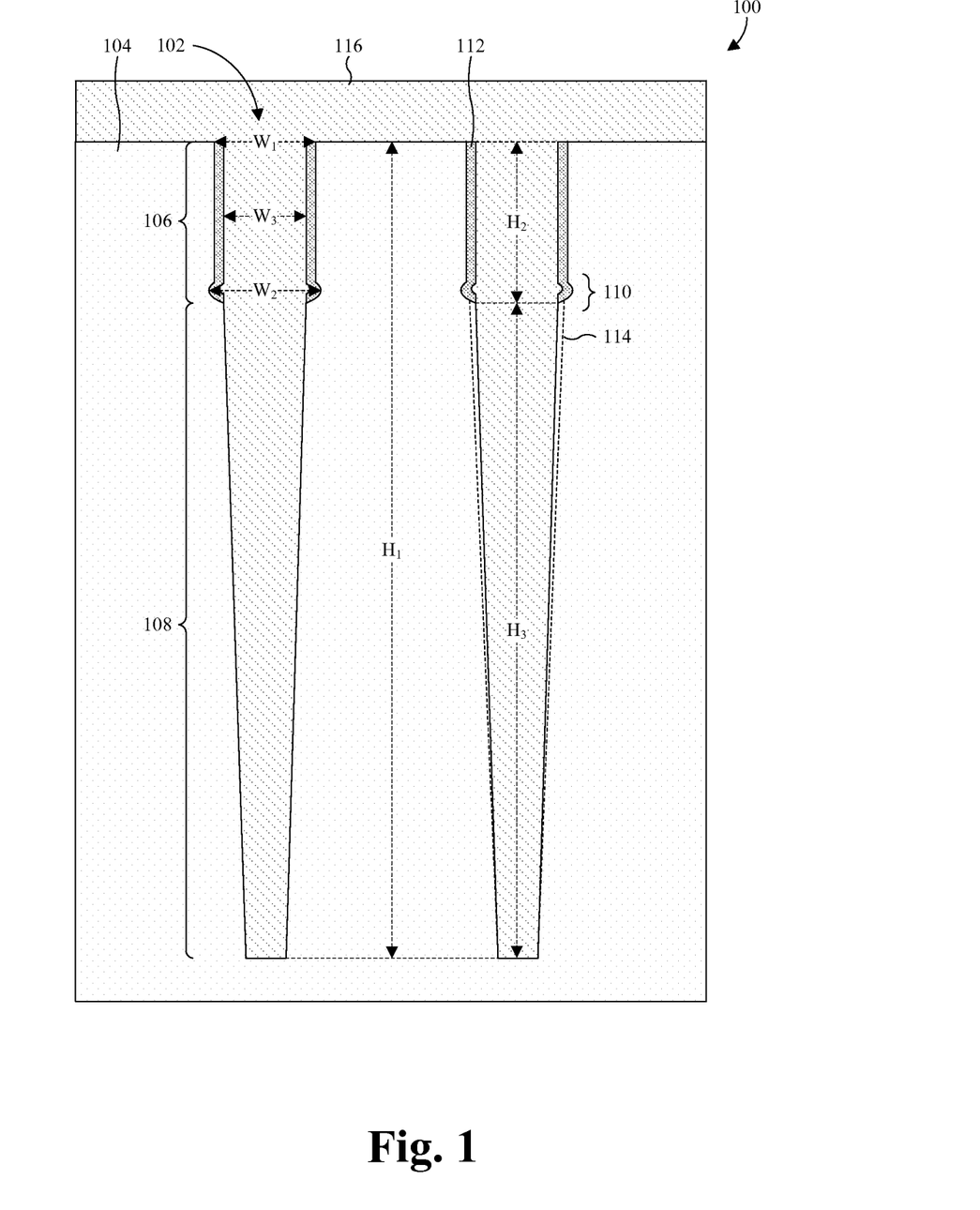
FIG. 1 illustrates a cross-sectional view of some embodiments of a semiconductor structure with a high aspect ratio opening.

With reference to FIG. 1, a cross-sectional view 100 of some embodiments of a semiconductor structure with high aspect ratio openings 102 is provided. The high aspect ratio openings 102 are arranged in a semiconductor substrate 104, and typically have ratios of height $H_1$ to top width $W_1$ (i.e., aspect ratio) of at least about 30. In some embodiments, the heights $H_1$ of the high aspect ratio openings 102 are about 80-120 micrometers, such as about 100 micrometers. Further, in some embodiments, the top widths $W_1$ of the high aspect ratio openings 102 are about 1-3 micrometers, such as about 1.2 micrometers. The high aspect ratio openings 102 typically have circular footprints, rectangular footprints, or elongated footprints (e.g., where the openings 102 are trenches), but other footprints are amenable.

The high aspect ratio openings 102 include corresponding upper regions 106 and corresponding lower regions 108. The upper regions 106 have substantially uniform or otherwise tapering widths, except that, in some embodiments, the upper regions 106 bulge at the bottoms to widths $W_2$. The bulges 110 typically increase in width by about 600-2000 angstroms, and typically have arcing sidewalls, such as semicircular sidewalls. Further, in some embodiments, the upper regions 106 have heights $H_2$ of about 9-11 micrometers, such as about 10 micrometers, and/or aspect ratios of about 1-13. Protective layers 112 corresponding to the upper regions 106 line sidewalls of the upper regions 106, thereby reducing the effective widths of the upper regions 106 to effective widths $W_3$. The protective layers 112 may be, for example, a dielectric, such as silicon dioxide, another oxide, silicon nitride, or another nitride, and/or may have, for example, thicknesses of about 100-1000 angstroms. The thicknesses may vary depending upon the heights $H_1$ of the high aspect ratio openings 102. For example, the less the heights of the high aspect ratio openings 102, the less the minimum thicknesses of the protective layers 112. In some embodiments, the thicknesses of the protective layers 112 are half the increase in width by the bulges 110 (e.g., $0.5*(W_2-W_1)$), so the effective widths $W_3$ at the bulges are about equal to the top widths $W_1$. Further, in some embodiments, the thicknesses of the protective layers 112 are substantially uniform.

The lower regions 108 underlie the upper regions 106 and have substantially uniform or otherwise tapering widths. In some embodiments, the widths of the lower regions 108 exceed the effective widths $W_3$ of the upper regions 106, such that the protective layers 112 and/or sidewalls of the upper regions 106 overhang the lower regions 108. For example, the lower regions 108 may take the profile shown by dashed lines 114. Further, the lower regions 108 have heights $H_3$ exceeding the heights $H_2$ of the upper regions. In some embodiments, the heights $H_3$ of the lower regions 108 are about 70-90 micrometers.

As seen hereafter, the protective layers 112 are arranged on sidewalls of the upper regions 106, and terminate at interfaces between the lower and upper regions 106, 108. The protective layers 112 advantageously prevent widening of the upper regions 106 while forming the lower regions 108. This, in turn, allows a greater level of control over the profiles of high aspect ratio openings 102, and improved polysilicon void control when filling the openings 102 with a polysilicon layer 116. Further, as seen hereafter, the protective layers 112 advantageously allow the high aspect ratio openings 102 to be formed more quickly. This, in turn, allows higher throughput. The protective layer 112 can manifest as a dielectric material, such as, for example, silicon dioxide or silicon nitride.

Figure 2A:
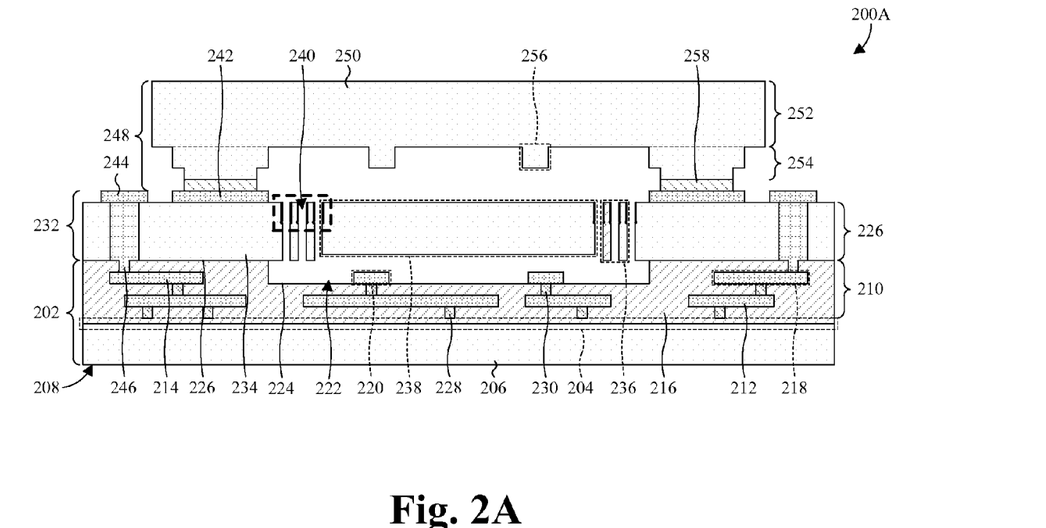
FIG. 2A illustrates a cross-sectional view of some embodiments of a microelectromechanical systems (MEMS) structure with a high aspect ratio opening.

With reference to FIG. 2A, a cross-sectional view 200A of some embodiments of a MEMS structure is provided. The MEMS structure includes an integrated circuit (IC) 202 that supports MEMS operations and is, for example, an application-specific-integrated circuit (ASIC). The IC 202 includes a device region 204 arranged over an IC substrate 206 of the IC 202 between a backside 208 of the IC 202 and a back-end-of-line (BEOL) metallization stack 210 of the IC 202. The device region 204 includes electronic components (not shown), such as, for example, one or more of transistors, capacitors, resistors, inductors, and diodes. The IC substrate 206 may be, for example, a bulk semiconductor substrate or a SOI substrate.

The BEOL metallization stack 210 includes metallization layers 212, 214 stacked within an interlayer dielectric (ILD) layer 216 of the BEOL metallization stack 210. The metallization layers 212, 214 include a metallization layer 214 including IC bond pads 218 and sensing electrodes 220. The IC bond pads 218 are laterally spaced around a cavity 222 defined over a surface 224 of the ILD 216 that is recessed relative to an upper surface 226 of the ILD 216. The sensing electrodes 220 are arranged along the recessed surface 224 in the cavity 222. Contacts 228 of the BEOL metallization stack 210 electrically couple the device region 204 to the metallization layers 212, 214. Further, vias 230 of the BEOL metallization stack 210 electrically couple the metallization layers 212, 214 to the IC bond pads 218 and the sensing electrodes 220. The ILD layer 216 may be, for example, a low κ dielectric (i.e., a dielectric with a dielectric constant less than about 3.9) or an oxide. The metallization layers 212, 214, the contacts 228, the vias 230, the IC bond pads 218, and the sensing electrodes 220 may be, for example, a conductive material, such as aluminum copper, tungsten, or another metal.

A MEMS device 232 is arranged over and bonded to the IC 202. The MEMS device 232 may be, for example, a motion sensor, a pressure sensor, or a microphone, and includes a MEMS substrate 234. The MEMS substrate 234 may be, for example, a bulk semiconductor substrate, such as a bulk silicon substrate, a SOI substrate, or a polysilicon-on-insulator (POI) substrate. The MEMS substrate 234 includes one or more springs 236 and a movable mass 238. The spring(s) 236 and the movable mass 238 are defined by high aspect ratio openings 240 through the MEMS substrate 234, typically having a ratio of height to width exceeding about 30. The spring(s) 236 connect the movable mass 238 to a peripheral region of the MEMS substrate 234, and suspend the movable mass 238 in the cavity 222. In operation, the movable mass 238 deflects in proportion to external stimuli, such as motion or sound waves, applied to the movable mass 238, whereby the external stimuli can be quantified by measuring the deflection. In some embodiments, deflection is measured using capacitive coupling between the movable mass 238 and the sensing electrodes 220.

A MEMS bond ring 242 and MEMS bond pads 244 are arranged over the MEMS substrate 234. The MEMS bond ring 242 surrounds the cavity 222. The MEMS bond pads 244 are electrically coupled to the IC bond pads 218 to provide an interface to the IC 202 from over the MEMS substrate 234. The MEMS bond pads 244 are electrically coupled to the IC bond pads 218 by through silicon vias (TSVs) 246 extending through the MEMS substrate 234 to the IC bond pads 218. In some embodiments, the widths of the TSVs 246 discretely taper towards the IC substrate 206. The TSVs 246 may comprise polysilicon or metal, such as tungsten, copper, or aluminum. The MEMS bond pads 244 and the MEMS bond ring 242 are or otherwise include, for example, metal, such as aluminum copper.

A cap device 248 is arranged over and bonded to the MEMS device 232, and includes a cap substrate 250. The cap substrate 250 includes a base region 252 and a ring-shaped mounting region 254. The base region 252 is arranged over the cavity 222 and has a generally uniform thickness. In some embodiments, the base region 252 includes stoppers 256 protruding into the cavity 222. The stoppers 256 reduce stiction between the base region 252 and the movable mass 238. The ring-shaped mounting region 254 extends vertically from the base region 252 and surrounds the cavity 222. In some embodiments, a width of the ring-shaped mounting region 254 discretely tapers towards the MEMS device 232, and/or a lower surface of the ring-shaped mounting region 254 is covered by a cap bonding ring 258 of the cap device 248. The cap substrate 250 may be, for example, a bulk semiconductor substrate or an SOI substrate. The cap bond ring 258 may be, for example, aluminum copper, germanium, or another metal.

Figure 2B:
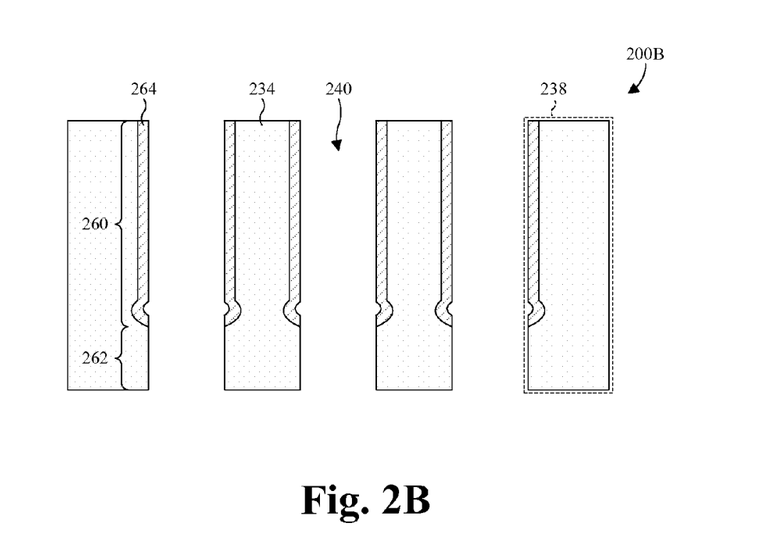
FIG. 2B illustrates an enlarged cross-sectional view of some embodiments of the high aspect ratio opening of FIG. 2A.

With reference to FIG. 2B, an enlarged cross sectional view 200B of some embodiments of the high aspect ratio openings 240 is provided. The high aspect ratio openings 240 include corresponding upper regions 260 and corresponding lower regions 262 (partially shown). The upper regions 260 have substantially uniform or otherwise tapering widths, except that, in some embodiments, the upper regions 260 bulge at the bottoms. Further, in some embodiments, the upper regions 260 have heights of about 9-11 micrometers. Protective layers 264 corresponding to the upper regions 260 line sidewalls of the upper regions 260. The protective layers 264 may be, for example, a dielectric, such as an oxide and/or a nitride, and/or may have, for example, thicknesses of about 100-1000 angstroms. Further, the protective layers 264 advantageously prevent widening of the upper regions while forming the lower regions 262, and allow the high aspect ratio openings 240 to be formed more quickly. The lower regions 262 underlie the upper regions 260 and have substantially uniform or otherwise tapering widths. Further, the lower regions 262 have heights exceeding the heights of the upper regions 260. In some embodiments, the heights of the lower regions 262 are about 70-90 micrometers.

Figure 3:
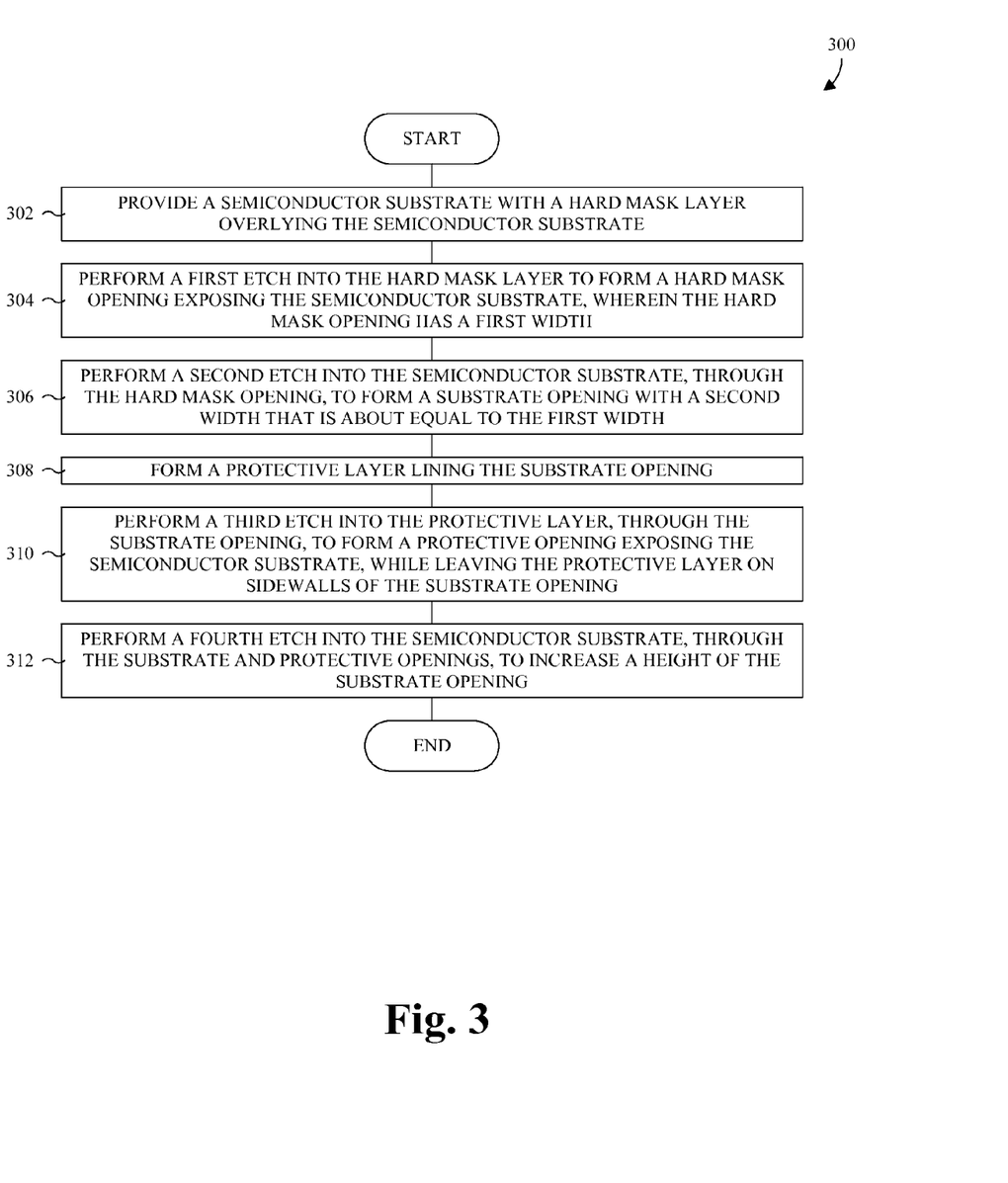
FIG. 3 illustrates a flowchart of some embodiments of a method for manufacturing a semiconductor structure with a high aspect ratio opening.

With reference to FIG. 3, a flowchart 300 of some embodiments of a method for manufacturing a semiconductor structure with a high aspect ratio opening is provided.

At 302, a semiconductor substrate is provided with a hard mask layer overlying the semiconductor substrate.

At 304, a first etch is performed into the hard mask layer to form a hard mask opening exposing the semiconductor substrate. The hard mask opening is formed with a first, bottom width.

At 306, a second etch is performed into the semiconductor substrate, through the hard mask opening. The second etch is performed to form a substrate opening with a second, top width that is about equal to the first width.

At 308, a protective layer is formed lining the substrate opening.

At 310, a third etch is performed into the protective layer, through the substrate opening, to form a protective opening exposing the semiconductor substrate, while leaving the protective layer on sidewalls of the substrate opening.

At 312, a fourth etch is performed into the semiconductor substrate, through the substrate and protective openings, to increase a height of the substrate opening. Advantageously, the upper sidewalls of the substrate opening are protected by the protective layer during the fourth etch. The second, top width of the substrate opening remains relatively unchanged over the course of the fourth etch. This, in turn, allows the substrate opening to be initially formed with a top width that matches a targeted width for the substrate opening (i.e., a width desired after the fourth etch), which facilitates faster etching. Further, the protective layer allows a more aggressive etch recipe to be used during the fourth etch, which further facilitates faster etching.

While the method described by the flowchart 300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 4-9, cross-sectional views of some embodiments of a semiconductor structure at various stages of manufacture are provided to illustrate the method of FIG. 3. Although FIGS. 4-9 are described in relation to the method, it will be appreciated that the structures disclosed in FIGS. 4-9 are not limited to the method, but instead may stand alone as structures independent of the method. Similarly, although the method is described in relation to FIGS. 4-9, it will be appreciated that the method is not limited to the structures disclosed in FIGS. 4-9, but instead may stand alone independent of the structures disclosed in FIGS. 4-9.

Figure 4:
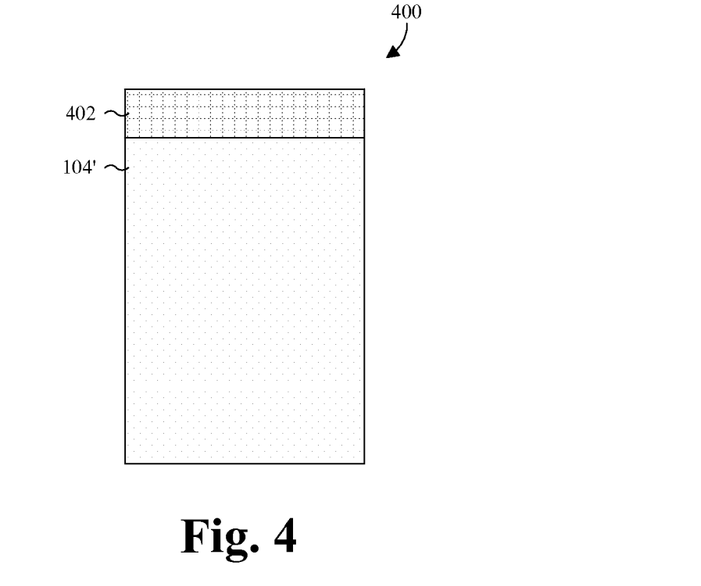
FIGS. 4-9 illustrate a series of cross-sectional views of some embodiments of a semiconductor structure at various stages of manufacture, the semiconductor structure having a high aspect ratio opening.

FIG. 4 illustrates a cross-sectional view 400 of some embodiments corresponding to Act 302. As illustrated, a semiconductor substrate 104' with a hard mask layer 402 arranged thereover is provided. The semiconductor substrate 104' may be, for example, a bulk semiconductor substrate, such as a bulk silicon substrate, or a SOI substrate. The hard mask layer 402 may be, for example, an oxide, such as silicon dioxide, or a nitride, such as silicon nitride. Further, the hard mask layer 402 may have, for example, a thickness of about 20-40 micrometers, such as about 30 micrometers.

Figure 5:
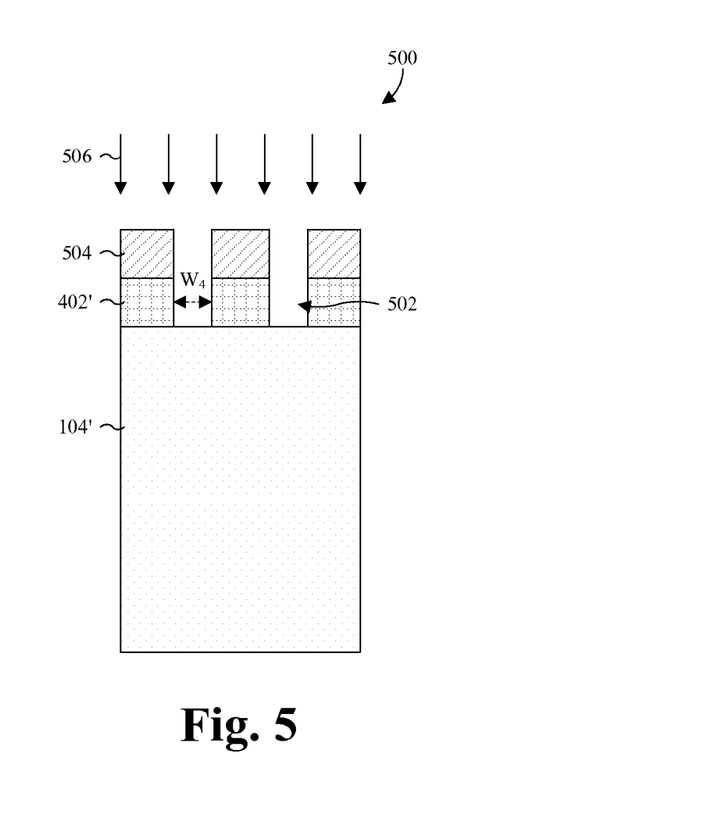

FIG. 5 illustrates a cross-sectional view 500 of some embodiments corresponding to Act 304. As illustrated, a first etch is performed into the hard mask layer 402 to form hard mask openings 502 corresponding to high aspect ratio openings being formed in the semiconductor substrate 104'. Typically, the high aspect ratio openings have a ratio of height to width of at least about 30, and/or have substantially uniform widths. The hard mask openings 502 are formed with widths $W_4$ that are typically about equal to the targeted top widths for the high aspect ratio openings. In some embodiments, the widths $W_4$ are about 1-2 micrometers, such as about 1.2 micrometers. Further, in some embodiments, the widths $W_4$ are about 600-2000 angstroms greater than the targeted top widths for the high aspect ratio openings.

The process for performing the first etch may include forming a first photoresist layer 504 masking regions of the hard mask layer 402 (see FIG. 4) surrounding regions of the hard mask layer 402 corresponding to the hard mask openings 502. An etchant 506 may then be applied to the hard mask layer 402 according to a pattern of the first photoresist layer 504, thereby forming the hard mask openings 502. After applying the etchant 506, the first photoresist layer 504 may be removed.

Figure 6:
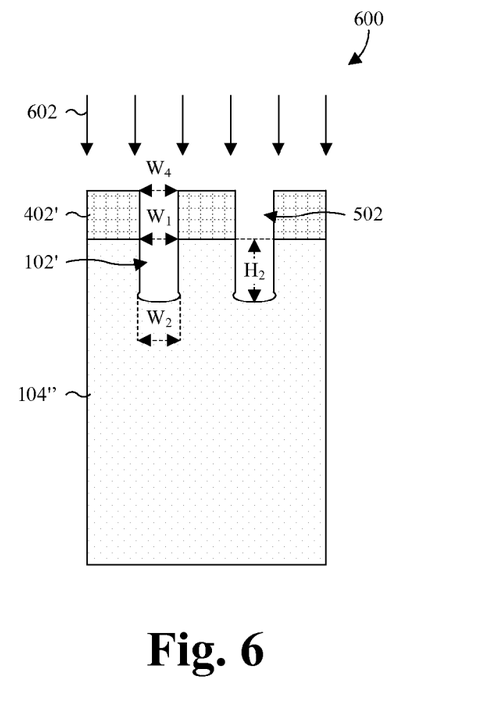

FIG. 6 illustrates a cross-sectional view 600 of some embodiments corresponding to Act 306. As illustrated, a second etch is performed into the semiconductor substrate 104' (see FIG. 5), through the hard mask openings 502, to form substrate openings 102' corresponding to the hard mask openings 502. The substrate openings 102' are formed with substantially uniform or otherwise tapering widths, except that, in some embodiments, the substrate openings 102' may be formed bulging at the bottoms to widths $W_2$. As seen hereafter, the bulging may accommodate protective layers formed hereafter, so the effective widths of the substrate openings 102' (i.e., the substrate opening widths less 2 times the thickness of the protective layers) at the bottom of the substrate openings 102' are about the same as the widths of the substrate openings 102' at the top of the substrate openings 102'.

Top widths $W_1$ of the substrate openings 102' may be formed about the same (e.g., +/−1%) as the widths $W_4$ of the hard mask openings 502. For example, the top widths $W_1$ may be formed at about 1-2 micrometers, such as about 1.2 micrometers. Heights $H_2$ of the substrate openings 102' may be formed substantially (e.g., several times) less than final heights for the high aspect ratio openings being formed. For example, the heights $H_2$ may be formed at about ⅕ to about 1/15, such as about 1/10, of the final heights for the high aspect ratio openings being formed. As another example, where the final heights for the high aspect ratio openings are between about 90-110 micrometers, the heights $H_2$ may be formed at about 9-11 micrometers, such as about 10 micrometers. Aspect ratios of the substrate openings 102' may be formed at about 1-13, such as about 10.

The process for performing the second etch may include applying one or more etchants 602 to the semiconductor substrate 104', through the hard mask openings 502. As the etchant(s) 602 are applied, the remaining hard mask layer 402' acts as a mask. The etchant(s) 602 may be wet or dry etchant(s). However, where the etchant(s) 602 are dry etchant(s), the flow rate of the dry etchant(s) may be increased towards the end of the second etch to form the bulging at the bottoms of the substrate openings 102'.

Figure 7:
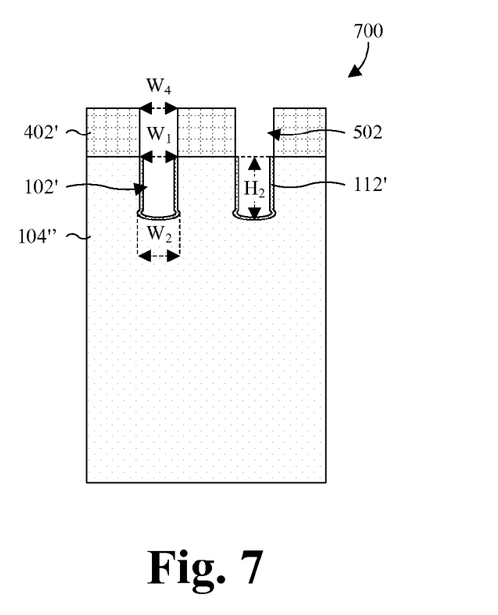

FIG. 7 illustrates a cross-sectional view 700 of some embodiments corresponding to Act 308. As illustrated, protective layers 112' corresponding to the substrate openings 102' are formed lining the corresponding substrate openings 102'. The protective layers 112' may be formed, for example, as oxide, such as silicon dioxide, or a nitride, such as silicon nitride, and/or may be formed having, for example, thicknesses of about 100-1000 angstroms. The thicknesses are typically substantially uniform, as is typical of conformal deposition techniques. Further, the thicknesses are typically half the increase in widths of the substrate openings 102' due to bulging at the bottom of the substrate openings 102'. Even more, the thicknesses typically vary depending upon the height of the high aspect ratio openings being formed (e.g., increase with the height of the high aspect ratio openings being formed).

The process for forming the protective layers 112' may include thermal oxidation, vapor deposition (e.g., chemical vapor deposition), or some other deposition technique. Although not shown, depending upon the deposition technique, the protective layers 112' may also line the remaining hard mask layer 402' and/or be part of a common protective layer.

Figure 8:
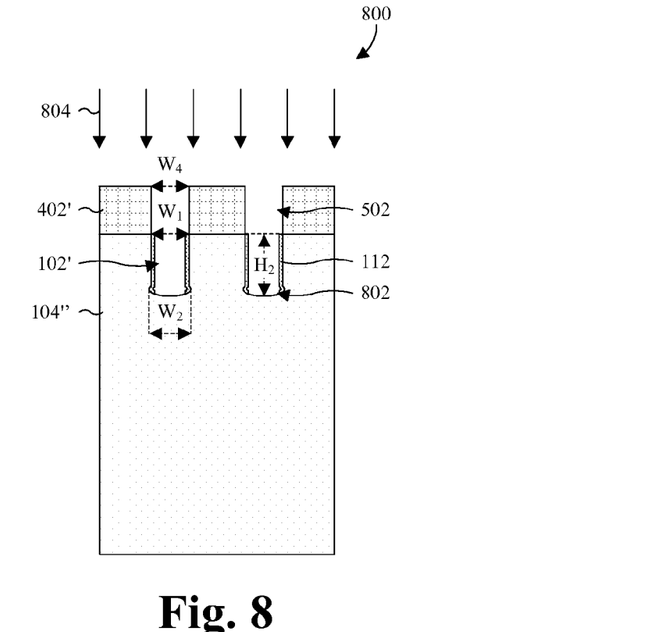

FIG. 8 illustrates a cross-sectional view 800 of some embodiments corresponding to Act 310. As illustrated, a third etch is performed into the protective layers 112' (see FIG. 7), through the substrate openings 102'. Hence, the embodiments of the protective layer 112' in FIG. 7 represent an intermediate state. The third etch removes lateral stretches or portions of the protective layers 112' and/or regions of the protective layers 112' lining bottoms surfaces of the substrate openings 102'. Further, the third etch forms protective openings 802 exposing the remaining semiconductor substrate 104".

The process for performing the third etch may include applying an etchant 804 to the protective layers 112', through the hard mask and substrate openings 102', 502. The etchant 804 is typically a dry etchant and anisotropic. As the etchant 804 is applied, the remaining hard mask layer 402' acts as a mask.

Figure 9:
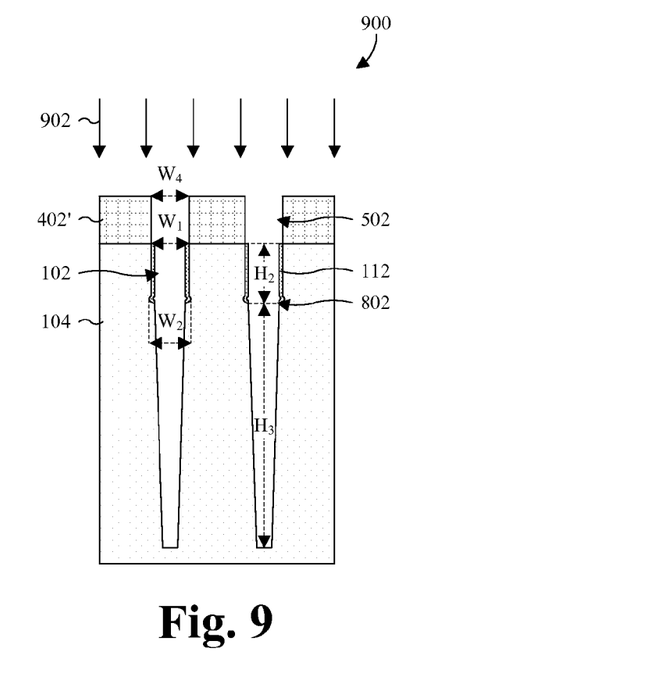

FIG. 9 illustrates a cross-sectional view 900 of some embodiments corresponding to Act 312. As illustrated, a fourth etch is performed into the remaining semiconductor substrate 104" (see FIG. 8), through the substrate and protective openings 102', 802 (see FIG. 8). The fourth etch increases the heights of the substrate openings 102' and the aspect ratios of the substrate openings 102' to at least about 30. Lower regions of the resulting substrate openings 102 underlying the remaining protective layers 112 are formed with substantially uniform or otherwise tapering widths. Heights $H_3$ of the lower regions may be several times the heights $H_2$ of the upper regions. For example, the heights $H_3$ of the lower regions may be at about 70-90 micrometers, such as about 80 micrometers.

The process for performing the fourth etch may include applying an etchant 902 to the remaining semiconductor substrate 104", through the hard mask and protective openings 502, 802. As the etchant 902 is applied, the remaining hard mask layer 402' acts as a mask. The etchant 902 may be a wet or dry etchant, and is typically anisotropic. Further, the etchant 902 may have a high selectivity (e.g., a selectivity of about 100) for the semiconductor substrate 104', relative to the remaining protective layers 112'. For example, where the semiconductor substrate 104' is silicon, and the protective layers 112' are oxide, the etchant 902 may one of known etchants with selectivities for silicon, relative to oxide, that are around 100.

The remaining protective layers 112 advantageously prevent the top widths $W_1$ of the substrate openings 102' from increasing much (e.g., +/−1%) while performing the fourth etch. This, in turn, results in a high level of control over the top widths $W_1$, which may translate into improved polysilicon void control. Further, the remaining protective layers 112 advantageously allow the third and fourth etches to be completed more quickly. The high selectivity of the fourth etch allows a more aggressive etch recipe. Further, since there is no or minimal widening of the substrate openings 102' during the fourth etch, the initial width of the substrate openings 102' can be larger than it would otherwise be. This, in turn, allows more etchant to come in contact with the remaining semiconductor substrate 104'. By allowing the third and fourth etches to be completed more quickly, the WPH that can be processed are increased, and throughput is improved.

Thus, as can be appreciated from above, the present disclosure provides a semiconductor structure. A semiconductor substrate defines an opening. The opening has a ratio of height to width of at least about 30, and the opening includes an upper region and a lower region. The lower region underlies and abuts the upper region. A protective layer lines sidewalls of the upper region. The protective layer extends from an upper surface of the semiconductor substrate and terminates at an interface between the upper and lower regions.

In other embodiments, the present disclosure provides a method for performing an etch. A semiconductor substrate is provided with a hard mask layer arranged over the semiconductor substrate. A first etch is performed into the hard mask layer to form a hard mask opening exposing the semiconductor substrate. The hard mask opening has a bottom width. A second etch is performed into the semiconductor substrate, through the hard mask opening, to form a substrate opening with a top width that is about equal to the bottom width of the hard mask opening. A protective layer is formed lining a sidewall of the substrate opening. A third etch is performed into the semiconductor substrate, through the hard mask opening, to increase a height of the substrate opening. The top width of the substrate opening remains substantially unchanged during the third etch.

In yet other embodiments, the present disclosure provides a MEMS structure. A MEMS device is bonded and electrically coupled to an integrated circuit. The MEMS device includes a MEMS substrate defining an opening. The opening has a ratio of height to width of at least about 30, and includes an upper region and a lower region. A protective layer lines sidewalls of the upper region, and extends from an upper surface of the MEMS substrate to an interface between the upper and lower regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a semiconductor substrate comprising an opening, wherein the opening has a ratio of height to width of at least about 30, wherein the opening includes an upper region and a lower region, the lower region underlying and abutting the upper region, wherein the opening further includes a bulge at a bottom of the upper region, the bulge spaced below a top surface of the semiconductor substrate and spaced over a bottom of the opening, and wherein the semiconductor substrate is continuous from the top surface of the semiconductor substrate to a bottom of the bulge;
 a protective layer lining sidewalls of the upper region, and extending from the top surface of the semiconductor substrate and terminating at an interface between the upper and lower regions, wherein the protective layer has an arcing sidewall contacting the bulge and contacting a top sidewall edge of the lower region, and wherein the arcing sidewall has a bottom sidewall edge that is spaced from the top sidewall edge;
 an integrated circuit; and
 a MEMS device bonded and electrically coupled to the integrated circuit, so as to define a cavity between the MEMS device and the integrated circuit, the MEMS device including the semiconductor substrate, wherein the semiconductor substrate comprises a spring and a movable mass, wherein the movable mass is suspended directly over the cavity by the spring and is configured to move in the cavity, wherein the spring is defined in part by the opening, and wherein the opening extends through the semiconductor substrate.

2. The semiconductor structure according to claim 1, wherein the semiconductor substrate is silicon, and wherein the protective layer is oxide or nitride.

3. The semiconductor structure according to claim 1, wherein the upper region has a substantially uniform width, and wherein the lower region has a width decreasing from top to bottom.

4. The semiconductor structure according to claim 3, wherein the protective layer extends laterally towards a center of the lower region, from a sidewall of the lower region, so as to overhang the lower region.

5. The semiconductor structure according to claim 4, wherein the bulge is defined by an arcing sidewall of the semiconductor substrate that arcs continuously from a linear sidewall of the upper region to the sidewall of the lower region, and wherein the sidewall of the lower region extends linearly from the bulge to the bottom of the opening that is spaced below the bulge.

6. The semiconductor structure according to claim 1, wherein a bottommost portion of the protective layer extends laterally towards a center of the lower region from the top sidewall edge so as to overhang the lower region.

7. A microelectromechanical systems (MEMS) structure comprising:
 an integrated circuit;
 a MEMS device bonded and electrically coupled to the integrated circuit, so as to define a cavity between the MEMS device and the integrated circuit, the MEMS device including a MEMS substrate comprising a spring and a movable mass, wherein the movable mass is suspended directly over the cavity by the spring and is configured to move in the cavity, wherein the spring is defined in part by an opening extending through the MEMS substrate, wherein the opening has a ratio of height to width of at least about 30, wherein the opening includes an upper region, a lower region, and a width-wise bulge, wherein the width-wise bulge is spaced over a bottom of the opening, between the upper and lower regions, and wherein a sidewall of the width-wise bulge arcs from a sidewall of the upper region to a sidewall of the lower region; and
 a protective layer lining the sidewall of the upper region and the sidewall of the width-wise bulge with a uniform thickness, and extending from an upper surface of the MEMS substrate to an interface between the width-wise bulge and the lower region, wherein the protective layer terminates at a sidewall of the protective layer that is even with the sidewall of the lower region.

8. The MEMS structure according to claim 7, wherein the MEMS substrate is silicon, and wherein the protective layer is oxide or nitride.

9. The MEMS structure according to claim 7, wherein the sidewall of the width-wise bulge is arcuate.

10. The MEMS structure according to claim 7, wherein a thickness of the protective layer is equal to about half of an increase in width by the width-wise bulge.

11. The MEMS structure according to claim 7, wherein sidewalls of the opening are a continuous material from the upper surface of the MEMS substrate to a lower surface of the MEMS substrate.

12. The MEMS structure according to claim 7, wherein the sidewall of the protective layer is spaced below a top edge of the width-wise bulge.

13. The MEMS structure according to claim 7, wherein a lower surface of the MEMS substrate is spaced below a lower surface of the movable mass.

14. A semiconductor structure, comprising:
a semiconductor substrate comprising an opening, wherein the opening comprises a width-wise bulge arranged on opposite sides of the opening and demarcating an upper region of the opening from a lower region of the opening, wherein the width-wise bulge has an arcing sidewall that arcs from a sidewall of the upper region to a sidewall of the lower region, and wherein the sidewall of the upper region is laterally spaced from the sidewall of the lower region;
a protective layer lining the sidewall of the upper region, and extending from a top surface of the semiconductor substrate to a boundary between the upper and lower regions, wherein the protective layer terminates at a first sidewall of the protective layer that is along the boundary, wherein the sidewall of the lower region has a top edge spaced between the first sidewall of the protective layer and the sidewall of the upper region, and further spaced over an interface between the first sidewall of the protective layer and a second sidewall of the protective layer, and wherein the second sidewall of the protective layer contacts the arcing sidewall of the width-wise bulge and arcs from the first sidewall of the protective layer;
an integrated circuit; and
a MEMS device bonded and electrically coupled to the integrated circuit, so as to define a cavity between the MEMS device and the integrated circuit, the MEMS device including the semiconductor substrate, wherein the semiconductor substrate comprises a spring and a movable mass, wherein the movable mass is suspended directly over the cavity by the spring and is configured to move in the cavity, wherein the spring is defined in part by the opening, and wherein the opening extends through the semiconductor substrate.

15. The semiconductor structure according to claim 14, wherein the upper region has a substantially uniform width and the lower region has a tapering width.

16. The semiconductor structure according to claim 14, wherein a height of the lower region is greater than a height of the upper region.

17. The semiconductor structure according to claim 14, wherein the sidewall of the lower region and the sidewall of the upper region both extend linearly, wherein the protective layer conformally lines the sidewall of the upper region and the arcing sidewall of the width-wise bulge, and wherein the first sidewall of the protective layer is spaced below a top edge of the width-wise bulge and extends linearly in the same direction as the sidewall of the lower region.

18. The semiconductor structure according to claim 17, wherein the semiconductor substrate is continuous from the top surface of the semiconductor substrate to a bottom edge of the arcing sidewall.

19. The semiconductor structure according to claim 14, wherein a bottommost portion of the protective layer extends laterally towards a center of the lower region from the top edge of the sidewall of the lower region so as to overhang the lower region.

20. The semiconductor structure according to claim 14, wherein the semiconductor substrate is silicon, and wherein the protective layer is oxide or nitride.

* * * * *